United States Patent
Lada et al.

(10) Patent No.: US 8,936,293 B2
(45) Date of Patent: Jan. 20, 2015

(54) ROBOTIC DEVICE FOR SUBSTRATE TRANSFER APPLICATIONS

(75) Inventors: Christopher O. Lada, Los Gatos, CA (US); Stuart Stephen Papworth Parkin, San Jose, CA (US); Mahesh Govind Samant, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 373 days.

(21) Appl. No.: 13/333,688

(22) Filed: Dec. 21, 2011

(65) Prior Publication Data

US 2013/0164113 A1 Jun. 27, 2013

(51) Int. Cl.
*B66F 19/00* (2006.01)

(52) U.S. Cl.
USPC .......................... 294/213; 414/751.1; 901/40

(58) Field of Classification Search
CPC .................. H01L 21/67389; H01L 21/67748; H01L 21/67707; H01L 21/67709; H01L 21/6831
USPC .................... 294/65.5, 213, 902, 86.4, 103.1; 414/749.2, 751.1, 793.2, 797.1, 806, 414/935, 937, 939, 941, 222.01, 222.05, 414/217, 800, 781, 783, 936, 744.1; 901/40; 361/234
See application file for complete search history.

(56) References Cited

U.S. PATENT DOCUMENTS

| | | | |
|---|---|---|---|
| 5,160,877 A | 11/1992 | Fujiwara et al. | |
| H0001378 H | 11/1994 | Crane et al. | |
| 5,366,340 A | 11/1994 | Vo et al. | |
| 5,727,832 A | 3/1998 | Holter | |
| 6,290,275 B1 | 9/2001 | Braam et al. | |
| 6,354,791 B1 | 3/2002 | Wytman et al. | |
| 6,386,609 B1 | 5/2002 | Govzman | |
| 6,500,737 B1 | 12/2002 | Yoo | |
| 6,513,848 B1 | 2/2003 | Shendon et al. | |
| 6,623,235 B2 | 9/2003 | Yokota et al. | |
| 6,682,113 B2 | 1/2004 | Cox et al. | |
| 6,685,422 B2 | 2/2004 | Sundar et al. | |
| 6,692,049 B2 | 2/2004 | Holbrooks | |
| 7,048,316 B1 | 5/2006 | Blank et al. | |
| 7,140,655 B2 | 11/2006 | Kesil et al. | |
| 7,233,842 B2 | 6/2007 | Bacchi et al. | |
| 7,281,741 B2 | 10/2007 | Woodruff et al. | |
| 7,374,386 B2 | 5/2008 | Talmer | |
| 7,625,027 B2 | 12/2009 | Kiaie et al. | |
| 7,857,569 B2 | 12/2010 | Hiroki et al. | |
| 2006/0261702 A1 | 11/2006 | Harada et al. | |
| 2009/0232631 A1* | 9/2009 | Zenpo et al. | 414/751.1 |

FOREIGN PATENT DOCUMENTS

GB        2171978 A      9/1986

* cited by examiner

*Primary Examiner* — Saul Rodriguez
*Assistant Examiner* — Ronald Jarrett
(74) *Attorney, Agent, or Firm* — Daniel E. Johnson

(57) ABSTRACT

A device for use in the semiconductor industry includes a robotic arm whose end effector includes electromagnetic means to hold a substrate carrier. A pushing member can move independently of a flat, spatula-like portion of the device and is configured to exert force against the substrate carrier while the spatula-like portion is retracted from the substrate carrier, after the substrate carrier has been brought to its intended position. In this manner, the position of the substrate carrier is maintained at its intended position as the spatula-like portion is retracted.

20 Claims, 12 Drawing Sheets

ROBOTIC DEVICE FOR SUBSTRATE TRANSFER APPLICATIONS

TECHNICAL FIELD

The invention relates to a robotic device, and more particularly, to an end effector suitable for transferring substrate carriers, such as those used in the semiconductor industry.

BACKGROUND

A universal aspect of automated semiconductor processing systems (including advanced research deposition and analysis systems) is some form of transfer mechanism for moving substrates into, through, and out of process/deposition/analysis chambers. Since these systems are expensive, a reasonable return on investment necessitates high system through-put, which can be achieved only if the transfer mechanism is reliable. However, the demands of most processes create challenges to maintaining reliability of the transfer mechanism. These demands can include high or low temperatures, vacuum, corrosive gases, special material requirements, motion control requirements, special sensing requirements, or a combination of the foregoing.

Transfer mechanisms, or robots, are generally designed to do a simple task, such as pick up a substrate carrier, move it, and place it in a desired location. Such simple actions are difficult in a vacuum—not just because of the obvious constraints of working in a vacuum, but also because of the significant effect that vacuum has on the tribological properties of materials. Unfortunately, the designs for robots to be used in vacuum are often derived from those designed for use in air, so that the reliability of robots in vacuum can degrade quickly. To mitigate reliability problems, several measures can be undertaken, such as avoiding contact or sliding between parts made of similar materials, using hard or wear-resistant coatings where contact does occur, and restricting movement to motions that are precise and carefully controlled to avoid collisions. Nevertheless, robotic devices having improved reliability and flexibility are desired.

SUMMARY

This invention addresses one of the challenges associated with a robot placing its load at an intended position. In semiconductor processing equipment, an intended position can be a receiving mechanism, a platen, a chuck in a process chamber, or a slot in a cassette. In prior art devices, as the robot withdraws its end effector after releasing its load, any slight contact with the load can dislodge that load from its intended position. In this invention, the robot employs a mechanism, called a pusher, to ensure that the deposited load (e.g., the carrier and its substrate) remains in its intended position while the end effector is withdrawn.

An embodiment of the invention is a device that comprises a robotic arm that includes an end effector. The end effector has (i) an electrical and/or magnetic unit (e.g., the unit may be constructed so that both electrical and magnetic modes of operation are possible) that has on and off modes, such that this unit, when it is in the on mode, provides an attractive holding force between the unit and a substrate carrier (so that the position of the substrate carrier remains fixed) and (ii) a pushing member that is configured to exert force against the substrate carrier, thereby preventing the substrate carrier from being retracted while the unit is retracted. The device further includes a motor for moving the pushing member.

One embodiment of the invention is a device that comprises a robotic arm that includes an end effector. The end effector includes (i) a spatula member whose distal end includes an electrical and/or magnetic unit having on and off modes, such that this unit, when it is in the on mode, provides an attractive holding force between the unit and a substrate carrier (so that the position of the substrate carrier remains fixed) and (ii) a pushing member that is configured to exert force against the substrate carrier, thereby preventing the substrate carrier from being retracted while the unit is retracted.

The following exemplary method can be used in conjunction with the embodiments described herein. This method includes:

(a) using the end effector to bring a selected substrate carrier to a desired position, with the attractive force holding the unit and the selected carrier together while the selected carrier is moved;

(b) moving the pushing member towards the selected carrier, so that the pushing member exerts force against the selected carrier;

(c) moving the unit away from the selected carrier, while the pushing member exerts force against the selected carrier, thereby maintaining the desired position of the selected carrier; and (d) retracting the pushing member so that the pushing member no longer contacts the selected carrier.

Steps (a), (b), (c), and (d) are preferably carried out in that order.

BRIEF DESCRIPTION OF THE DRAWINGS

FIG. 2, which includes FIGS. 2A, 2B, and 2C, shows various views of a portion of a first embodiment of a robotic device (that portion being designated herein as the "assembly") and its end effector, including both an electromagnetic unit (also shown in FIG. 1) for holding and moving a substrate carrier, as well as a pusher for keeping the substrate carrier in place, in which:

FIG. 2A is a perspective view of the assembly and the substrate carrier;

FIG. 2B is a top cutaway view of the end effector and the substrate carrier; and FIG. 2C is a cutaway view of the coils in the electromagnetic unit.

FIG. 3, which includes FIGS. 3A, 3B, 3C, 3D, and 3E, shows various views of a portion of a second embodiment of an assembly and its end effector, including both a magnetic unit for holding and moving a substrate carrier, as well as a pusher for keeping the substrate carrier in place, in which:

FIG. 3A is a perspective view of the assembly and the substrate carrier;

FIG. 3B is a top cutaway view of the end effector and the substrate carrier;

FIG. 3C is a cross sectional view of the end effector and the substrate carrier;

FIG. 3D is a view of the end effector and the substrate carrier, showing the magnetic unit in the "on" position; and FIG. 3E is a view of the end effector and the substrate carrier, showing the magnetic unit in the "off" position.

FIG. 5, which includes

DETAILED DESCRIPTION

Figure 1:
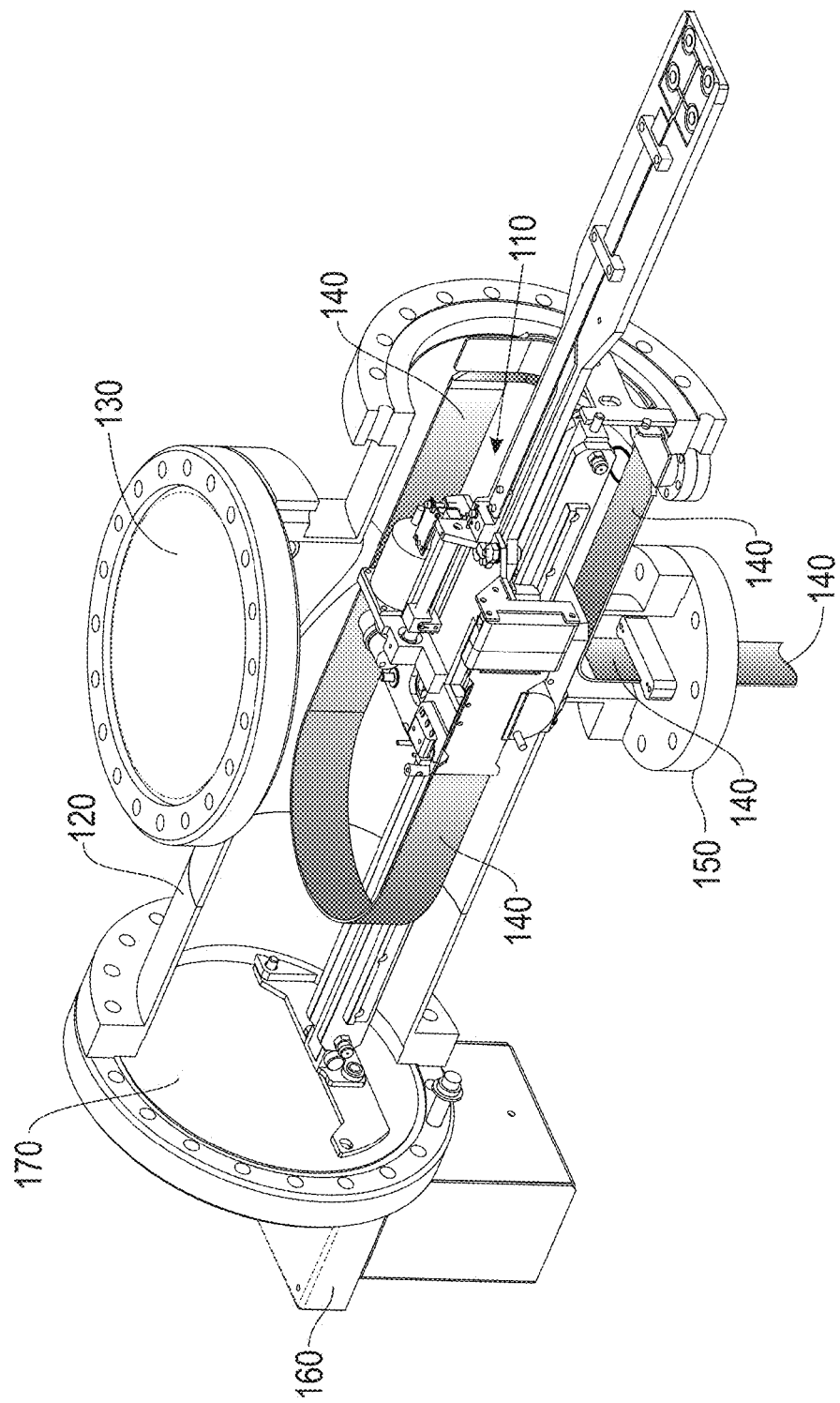
FIG. 1 illustrates an embodiment of the invention housed within a robot chamber, which in turn is connected to one or more other chambers used for semiconductor processing.

Preferred embodiments of the invention are now described with respect to the figures. FIG. 1 shows a robotic device 110 mounted within a robot chamber 120 (shown as a cutaway for clarity). The robot chamber 120 includes a viewing port 130 that includes transparent glass through which the robotic device 110 can be viewed. The robotic device 110 can be moved through the robot chamber 120 towards an adjacent load lock chamber or cassette loading chamber (not shown, but the load lock chamber would be connected to, and to the right of, the robot chamber 120 in FIG. 1), where a substrate carrier can be loaded onto the robotic device 110 or, alternatively, removed from it and inserted into a receiver in the load lock chamber. The load lock chamber is in turn connected to a process chamber (not shown, but still further to the right), such as a deposition chamber (or an etching chamber), where materials may be deposited onto (or etched away from) a substrate or wafer positioned by the robotic device 110. Electrical power is supplied to the robotic device 110 through a ribbon cable 140 that passes through an electrical feedthrough 150. More precisely, the portion of the ribbon cable 140 that is external to the robot chamber 120 mates with electrical pins (not shown) in the electrical feedthrough 150, and the portion of the ribbon cable 140 within the robot chamber 120 likewise mates with the electrical pins, so that no mechanical feedthrough is used that might otherwise compromise the integrity of the vacuum. Alternatively, the cable 140 external to the robot chamber 120 need not be a ribbon cable. To the left of the robot chamber 120 is a distance sensing laser assembly 160. A laser beam (not shown) directed through the glass of a second viewing port 170 can be used to establish the approximate position of the robotic device 110.

Electromagnetic Embodiment

Figure 2A:
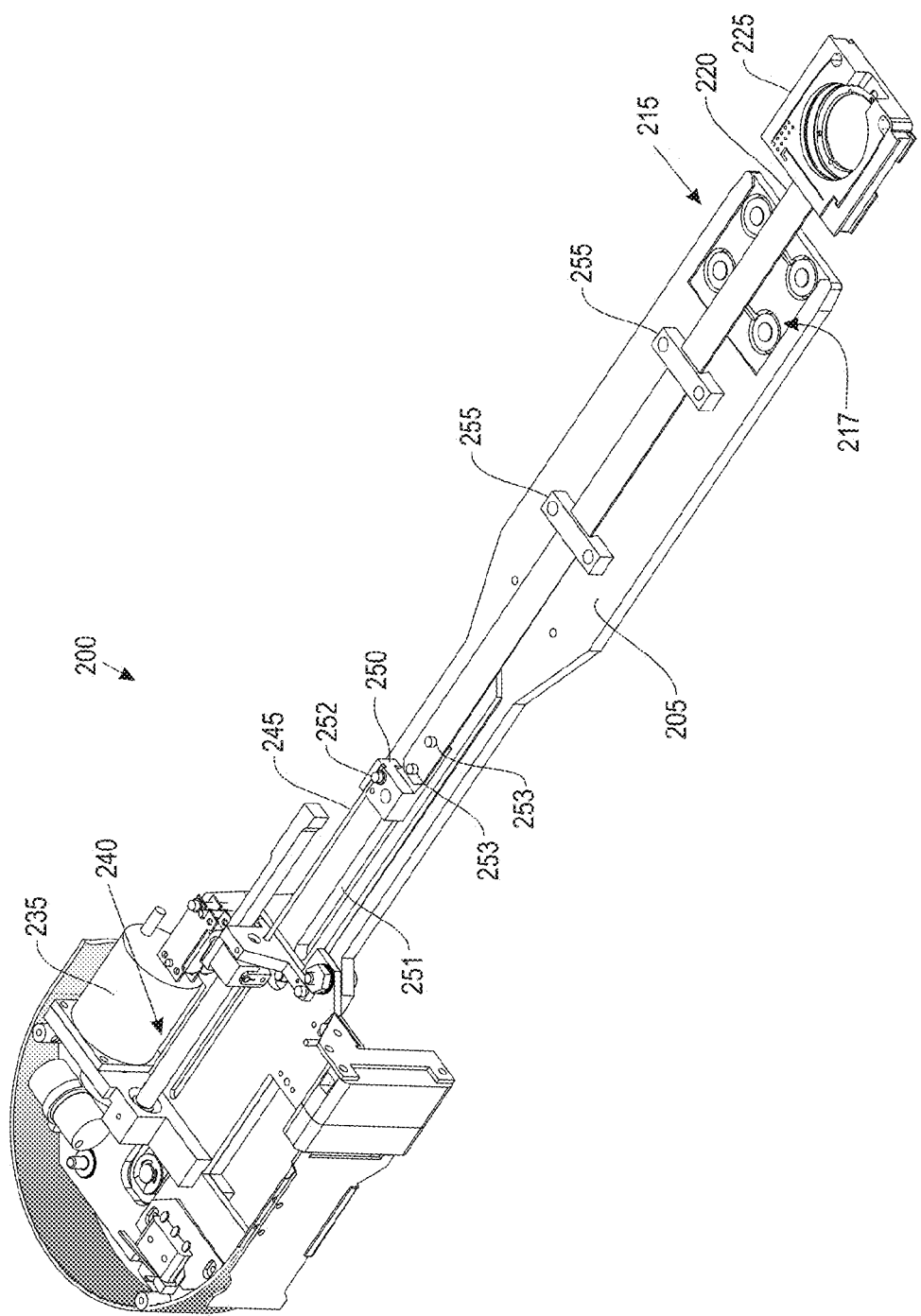
Figure 2B:
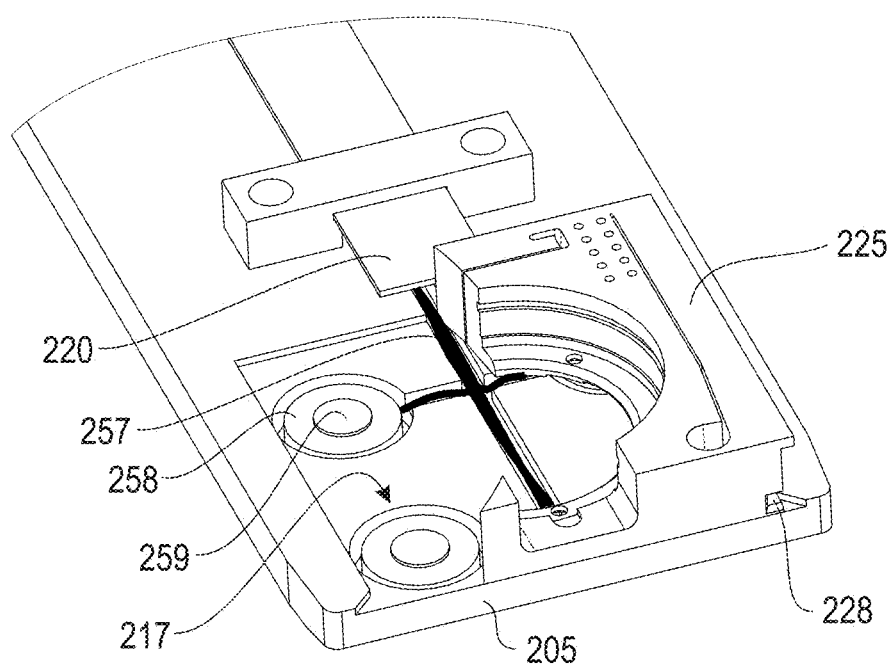
Figure 2C:
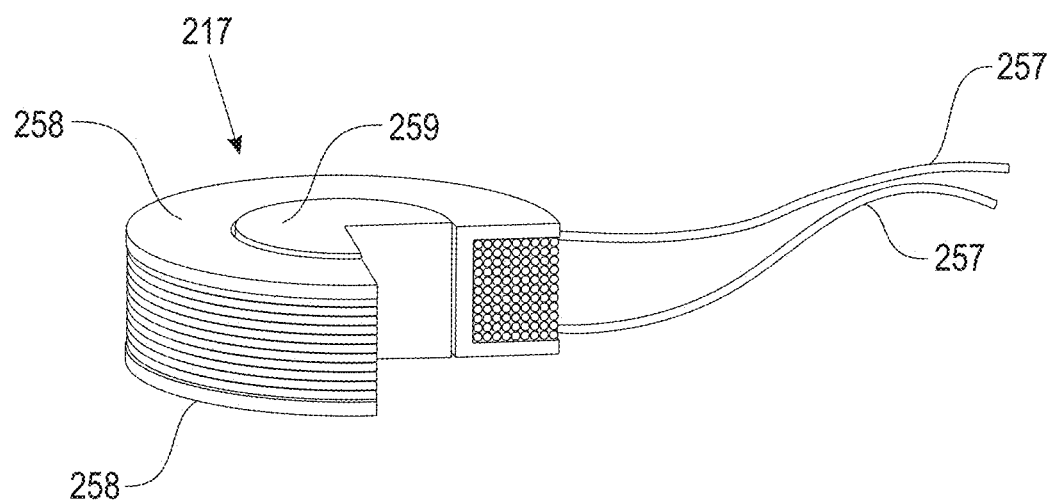

FIG. 2A shows in greater detail that portion of the robotic device 110 designated as the assembly 200, which includes a spatula 205 having an electromagnetic unit 215 at its distal end. The assembly 200 also includes a pusher 220. The end effector portion of the robotic device 110 can help position a substrate carrier 225 using the electromagnetic unit 215, which includes at least one electromagnetic coil 217. (Four such coils 217 are shown in FIG. 2A.) When they are activated, the coils 217 hold the substrate carrier 225 as a result of the magnetic force between the coils and the substrate carrier, thereby permitting the substrate carrier 225 to be moved securely from one location to another. For the substrate carrier 225 (and the other substrate carriers described herein), a substrate can be placed in the center, hollow portion of the substrate carrier and then overlaid with a block of SiC, which can be heated with infrared radiation to heat the underlying substrate; neither the substrate nor the SiC block is shown in FIG. 2A, 2B, or 2C.

The substrate carrier 225 can then be brought to an intended position, e.g., the grooves 228 in the substrate carrier can mate with a receiver in a load lock chamber. At this point, the coils 217 can be deactivated by turning off the current supplied to them. The spatula 205 is then pulled back from the substrate carrier 225; note that the spatula slides underneath the substrate carrier as it is retracted from the substrate carrier. (This is most easily visualized with respect to FIG. 2B, which shows the spatula 205 underneath, and in contact with, the substrate carrier 225.) Unfortunately, even slight contact between mechanical parts under vacuum can generate high frictional forces. Thus, one could imagine that as the spatula 205 is withdrawn, the substrate carrier 225 might be unintentionally dragged along as a result of contact with the spatula, thereby dislodging the substrate carrier from its intended position.

To circumvent this problem, as the coils 217 are being deactivated, the pusher 220 is moved towards the substrate carrier until contact occurs (or alternatively, the pusher may be brought into contact with the substrate carrier before or after the coils are deactivated). The pusher 220 is used to apply force against the substrate carrier 225 while the spatula 205 is retracted, as shown in FIGS. 2A and 2B; doing so keeps the substrate carrier 225 in place (e.g., at a desired location in a process chamber or in a cassette in a load lock chamber).

Actuation of the pusher 220 is now described with respect to FIG. 2A. A pusher motor 235 is mechanically tied to various components designated collectively as the pusher drive mechanism 240. The pusher drive mechanism 240 may include conventional components, such as one or more gears, lead screws, traveling nuts, and limit switches for constraining motion. The pusher drive mechanism 240 engages a pusher drive rod 245, thereby pushing this rod either forwards or backwards relative to the spatula 205. The pusher drive rod 245 is in turn fixed to a pusher guide block 250 (e.g., by a screw 252), which in turn is connected to the pusher 220 (e.g., by screws 253). As the pusher guide block 250 is moved forwards or backwards within a groove 251 in the spatula 205, the pusher 220 is likewise moved forwards or backwards. In this manner, the pusher 220 can be made to butt up against the substrate carrier 225 or retracted from it. Two pusher guide brackets 255 help keep the pusher 220 in place as it is moved back and forth.

The coils 217 and their actuation are now described with respect to FIGS. 2B and 2C. FIG. 2B shows two coils 217, with two other coils being hidden underneath the substrate carrier 225. Electrical current flows through the coils 217 so that the coils act as magnets; the two coils shown in FIG. 2B are magnets whose top ends have opposite polarities, e.g., north and south. The two other coils (which are not visible in FIG. 2B) have polarities such that coils that are at diagonals to each other have the same polarity. When the coils 217 are activated, magnetic flux lines from the electromagnets pass through the substrate carrier 225, and the magnetic force keeps the substrate carrier in contact with the spatula 205. The substrate carrier in this embodiment is made of magnetic material, such as martensitic stainless steel. Current may be supplied to the coils 217 through one or more wires 257. The wiring to the coils 217 may be either in parallel or series, provided that the desired polarities are produced.

The construction of an individual coil 217 is illustrated in FIG. 2C. The wires forming the coil 217 may be 23 gauge copper wire insulated with, for example, GE varnish that forms a sheath around the wire. The wire 257 may be wound around a bobbin 258 that surrounds a pole piece 259. The pole pieces 259 may be made from material such as soft iron or silicon iron.

Shunted Magnet Embodiments

FIG. 3 shows another embodiment in which magnetic force is used to hold a substrate carrier. FIG. 3A shows in greater detail that portion of a robotic device (similar to the robotic device 110) designated as the assembly 200a, which includes a spatula 205a having a magnet unit 218 at its distal end. The assembly 200a also includes a pusher 220a. The end effector of this embodiment can help position a substrate carrier 225a using the magnet unit 218, which is activated mechanically as described below. When the magnet unit 218 is activated, the substrate carrier 225a is held as a result of the magnetic force between a magnet 262 (shown in FIG. 3C) in the unit 218 and the substrate carrier, thereby permitting the substrate carrier 225a to be moved securely from one location to another.

The substrate carrier 225a can then be brought to an intended position, e.g., the grooves 228a in the substrate carrier can mate with a receiver in a load lock chamber. At this point, the magnet unit 218 can be deactivated. The spatula 205a is then pulled back from the substrate carrier 225a; note that the spatula slides underneath the substrate carrier as it is retracted from the substrate carrier. (This is most easily visualized with respect to FIG. 3B, which shows the spatula 205a underneath, and in contact with, the substrate carrier 225a.)

As with the previously described embodiment, to reduce the risk of dislodging the substrate carrier 225a from its intended position as the spatula 205a is withdrawn, the pusher 220a is moved towards the substrate carrier until contact occurs (e.g., the pusher may be brought into contact with the substrate carrier before, during, or after deactivation of the magnet unit 218). The pusher 220a is used to apply force against the substrate carrier 225a while the spatula 205a is retracted (see FIGS. 3A and 3B); doing so keeps the substrate carrier 225a in place (e.g., at a desired location in a process chamber or in a cassette in a load lock chamber).

Figure 3A:
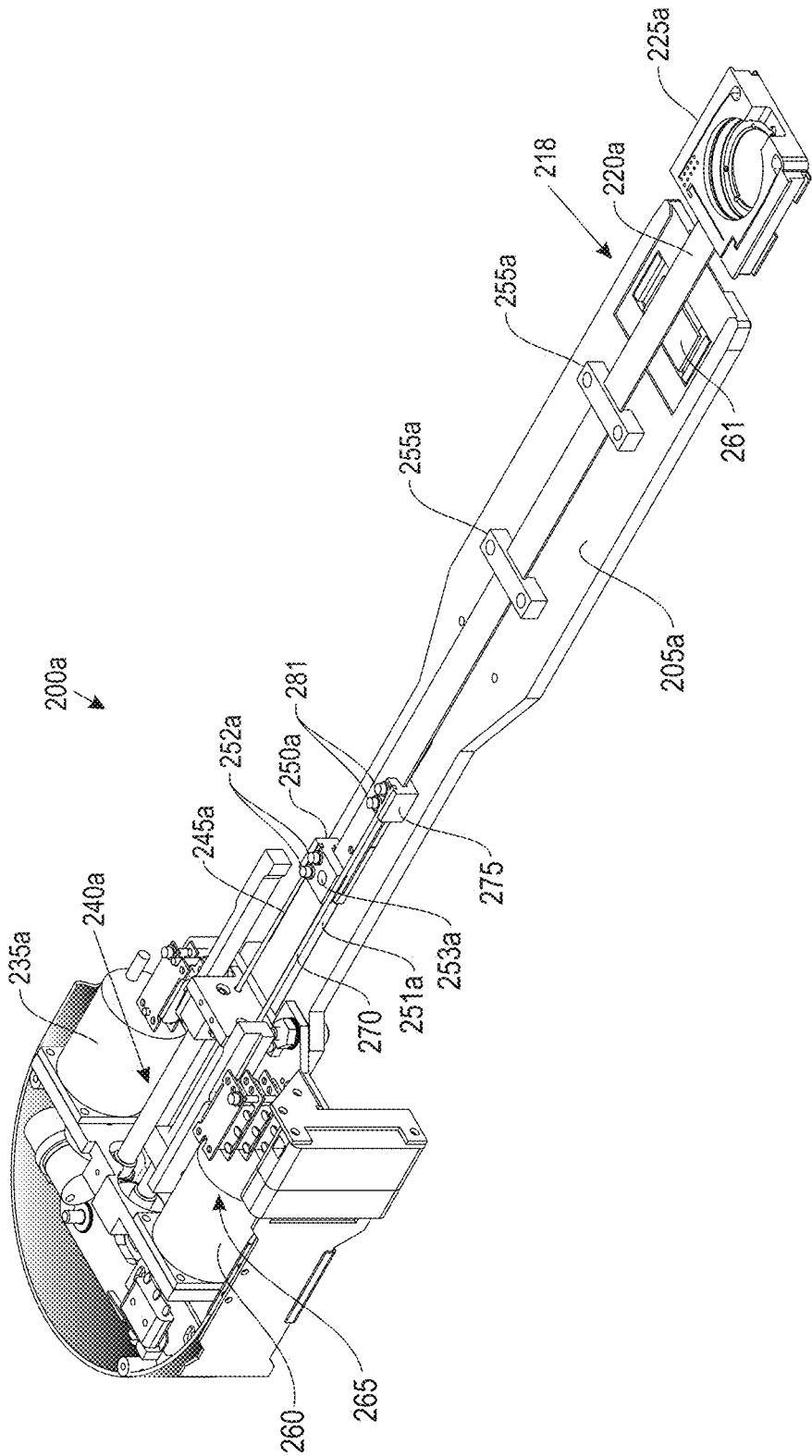
Figure 3B:
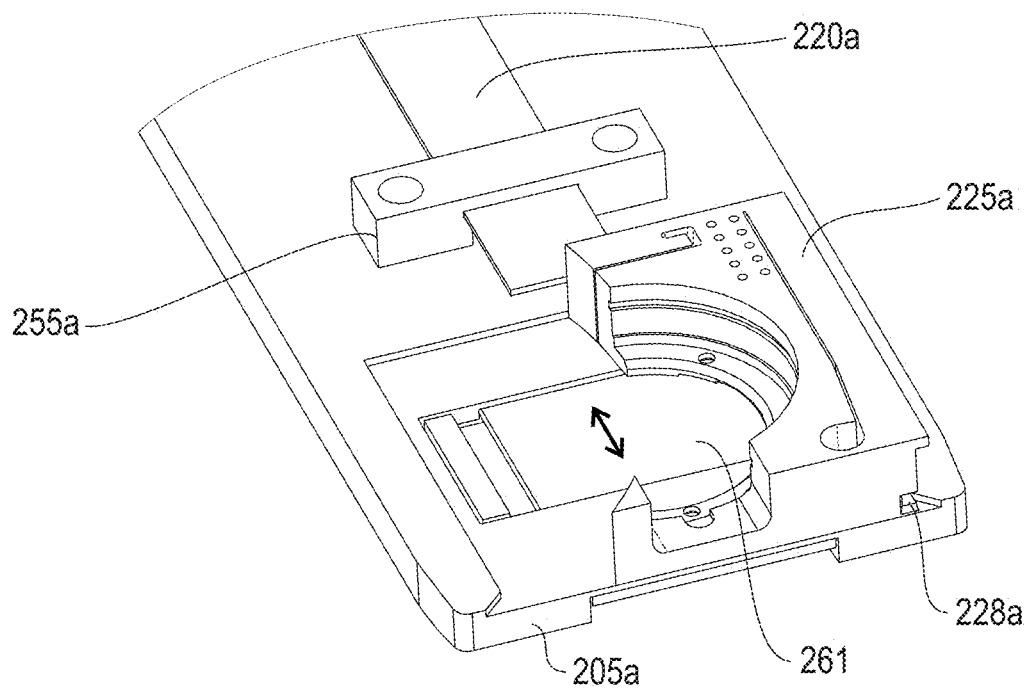

Actuation of the pusher 220a is now described with respect to FIG. 3A. A pusher motor 235a is mechanically tied to various components designated collectively as the pusher drive mechanism 240a. The pusher drive mechanism 240a may include conventional components, such as one or more gears, lead screws, traveling nuts, and limit switches for constraining motion. The pusher drive mechanism 240a engages a pusher drive rod 245a, thereby pushing this rod either forwards or backwards relative to the spatula 205a. The pusher drive rod 245a is in turn fixed to a pusher guide block 250a (e.g., by one or more screws 252a), which in turn is connected to the pusher 220a (e.g., by one or more screws 253a). As the pusher guide block 250a is moved forwards or backwards within a slot 251a in the spatula 205a, the pusher 220a is likewise moved forwards or backwards. In this manner, the pusher 220a can be made to butt up against the substrate carrier 225a or retracted from it. Two pusher guide brackets 255a help keep the pusher 220a in place as it is moved back and forth.

Figure 3C:
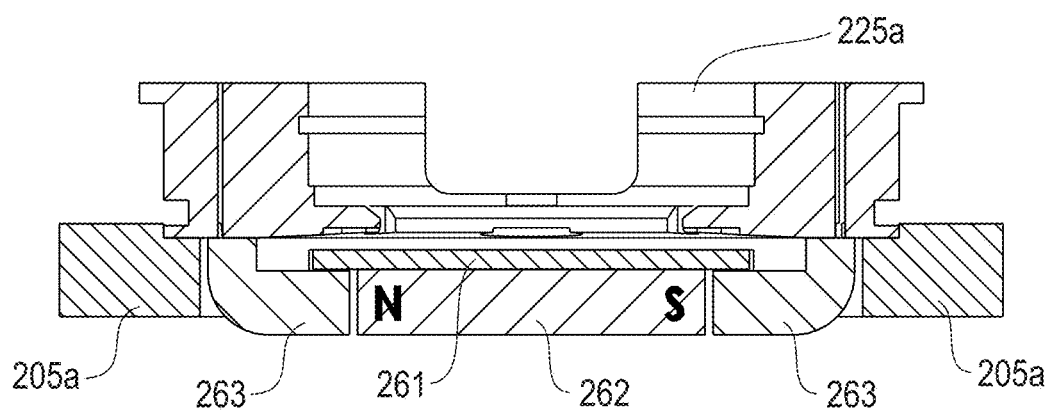
Figure 3D:
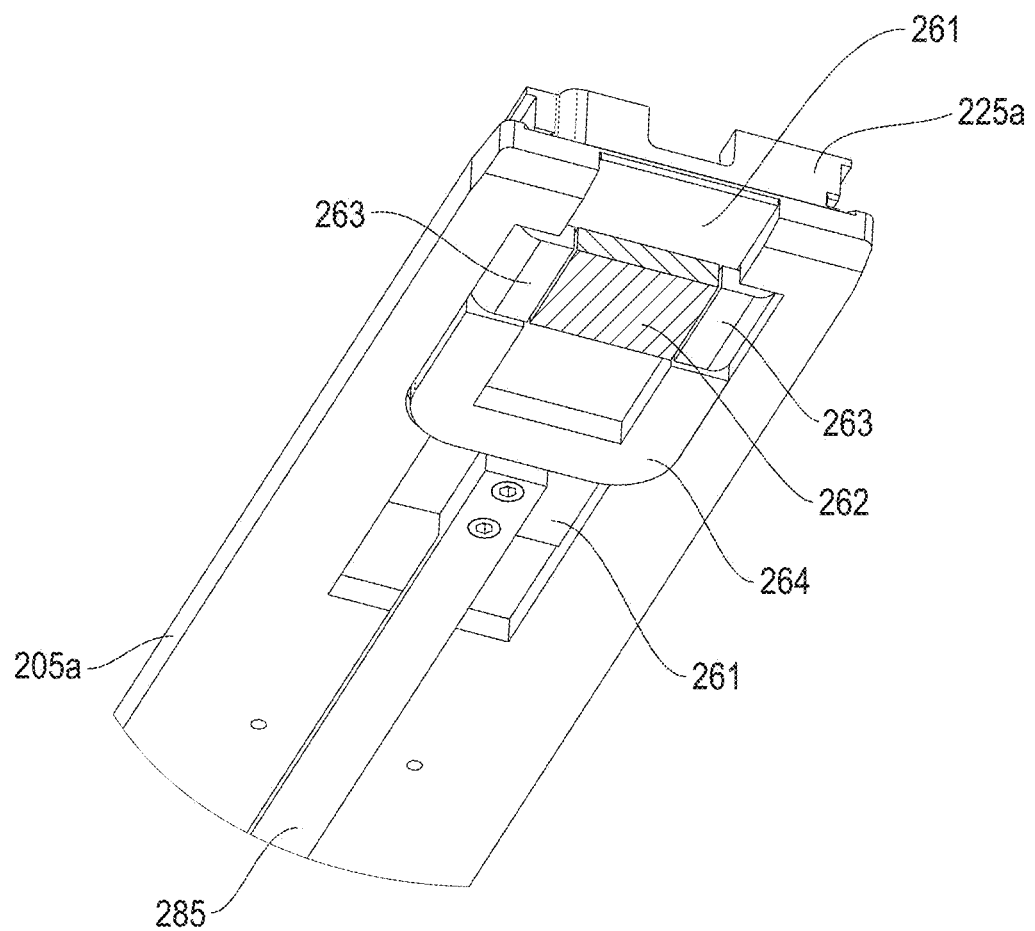
Figure 3E:
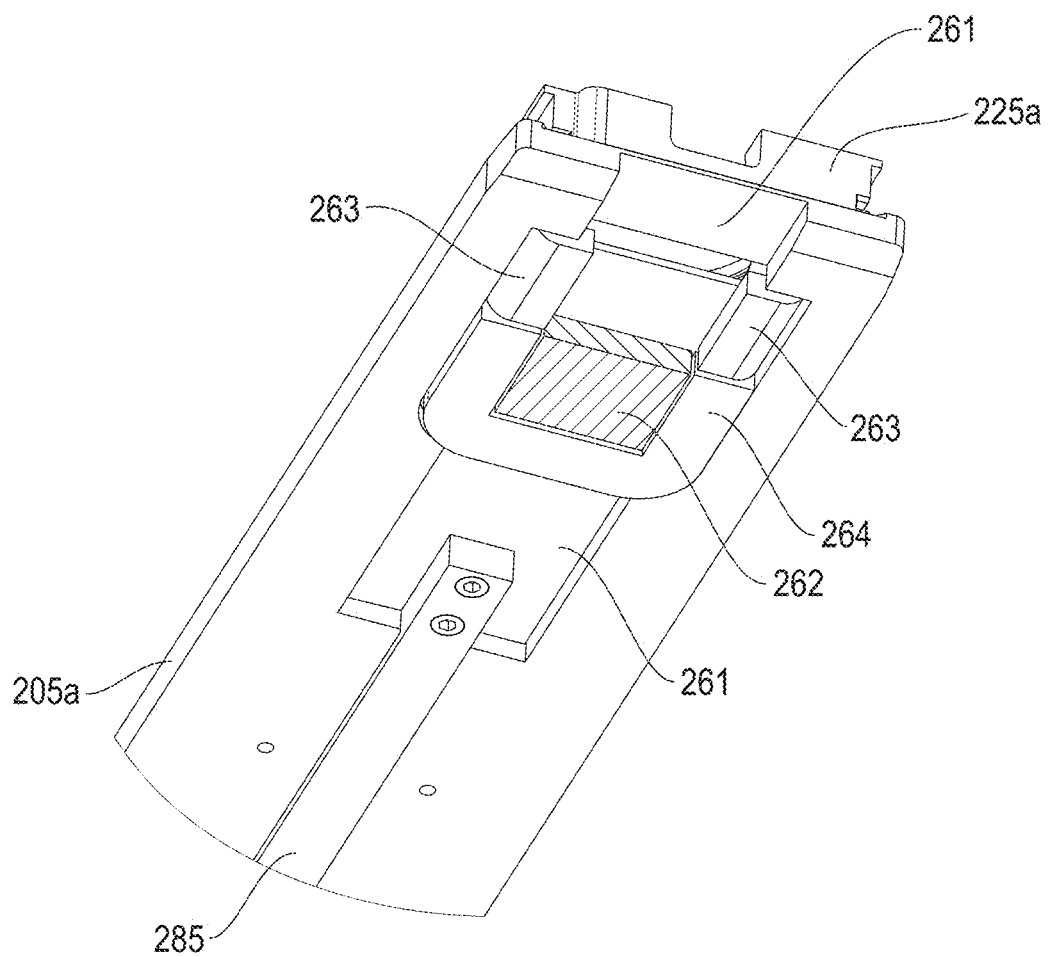

The magnet unit 218 and the movement of its magnet mount 261 and magnet 262 are now described. As seen in FIGS. 3C and 3D, when the magnet unit 218 is activated or in the "on" position, the magnet 262 (which can be made of $Nd_2Fe_{14}B$, for example, and can be epoxied or otherwise secured to the magnet mount 261), is positioned between two pole pieces 263 (e.g., made of soft iron) and directly underneath the substrate carrier 225a (which is likewise made of a magnetic material). The magnetic attractive force between the magnet 262 and the substrate carrier 225a is sufficiently strong to hold the substrate carrier in place. This "on" position occurs when the magnet mount 261 (and the magnet 262 to which it is attached) is extended distally. As shown in FIG. 3E, on the other hand, when the magnet mount 261 is retracted, the magnet 262 is partially surrounded by a shunt 264 and is far enough away from the substrate carrier 225a that there is no significant attractive force between the magnet and the substrate carrier; in this case, the magnet unit 218 is in the "off" position. Thus, the magnet mount 261 can be retracted or extended (as suggested by the double arrowhead in FIG. 3B), leading to the magnet unit 218 being deactivated or activated, respectively.

The magnet mount 261 can be extended or retracted with a magnet mount motor 260 as follows. The magnet mount motor 260 is mechanically tied to various components designated collectively as the magnet mount motor mechanism 265. The motor mechanism 265 may include conventional components, such as one or more gears, lead screws, traveling nuts, and limit switches for constraining motion. The motor mechanism 265 engages a magnet mount drive rod 270, thereby pushing this rod either forwards or backwards relative to the spatula 205a. The drive rod 270 is in turn fixed to a magnet mount guide block 275 by one or more screws 281. As the drive rod 270 is moved forwards or backwards, the magnet mount guide block 275 moves within the slot 251a in the spatula 205a. The magnet mount 261 is likewise moved forwards or backwards, since the drive rod 270 is tied to the guide block 275, and the guide block 275 is in turn tied to a magnet mount connector 285 that extends along the underside of the spatula 205a and is fixed to the magnet mount 261 (see FIGS. 3D and 3E). Limits switches in the pusher drive mechanism 240a and the magnet mount motor mechanism 265 ensure that the pusher guide block 250a and the magnet mount guide block 275 do not run into each other.

Other shunted magnet embodiments, which are not shown, are also contemplated. For example, the spatula may be embedded with one or more permanent magnets surrounded by a retractable sleeve made of mu-metal. When the sleeve surrounds the magnet(s), the magnetic field is effectively screened from the substrate carrier, so that it can be easily moved. On the other hand, when the sleeve is retracted, the magnetic field is able to interact with the substrate carrier, thereby fixing its location. In yet another shunted magnet embodiment, blocks of magnetic material separated by a block of non-magnetic material may be constructed so that the magnet can be turned on and off, in analogy with how magnetic bases are constructed (e.g., those used on optical tables).

Electrostatic Embodiment

Figure 4:
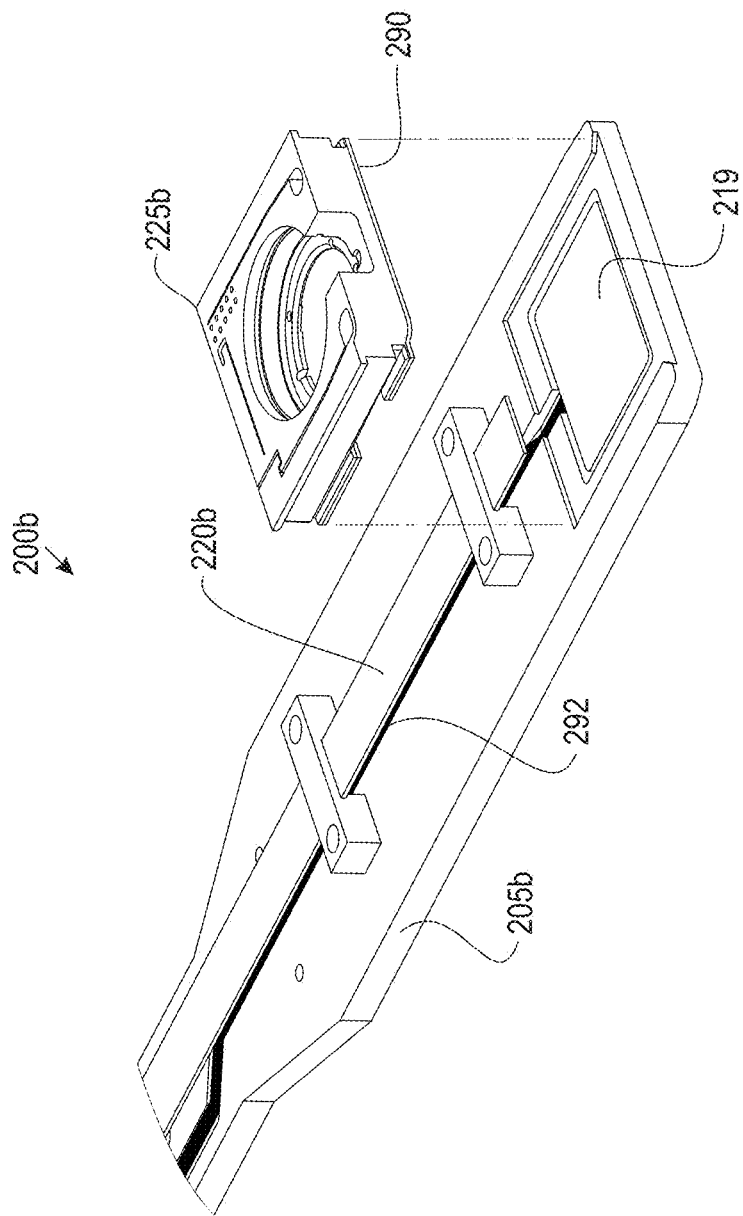
FIG. 4 is a perspective view of the end effector of a third embodiment, including both an electrostatic unit for holding and moving a substrate carrier, as well as a pusher for keeping the substrate carrier in place.

In the embodiment shown in FIG. 4, electrostatic force is used to hold a substrate carrier. This embodiment is essentially identical to the electromagnetic embodiment described above in connection with FIG. 2, except at its distal end. An assembly 200b includes a spatula 205b having an electrostatic plate 219 (e.g., made of copper encapsulated with an insulator); alternatively, multiple electrodes may be embedded in the spatula. The assembly 200b also includes a pusher 220b. The end effector portion of this embodiment can help position a substrate carrier 225b (which may include a dielectric plate or coating 290). When high voltage is applied to the electrostatic plate 219 (e.g., through a wire 292 that is tied to a voltage supply at the proximal end of the robotic device), an electrostatic force arises between the electrostatic plate 219 and the substrate carrier 225b due to redistribution of charge within that portion of the substrate carrier closest to the spatula 205. The substrate carrier 225b is held in place as a result of this force, thereby permitting it to be moved securely from one location to another, like the substrate carrier 225 described above in connection with the electromagnetic embodiment. (When the voltage to the electrostatic plate 219 is turned off, the attractive force is eliminated.) Similarly, the pusher 220b can be used like the pusher 220 of FIG. 2 to reduce the risk of dislodging the substrate carrier 225b from its intended position as the spatula 205b is withdrawn. The pusher 220b can be actuated like its counterpart 220 of FIG. 2.

Additional Mechanical Details

Figure 5A:
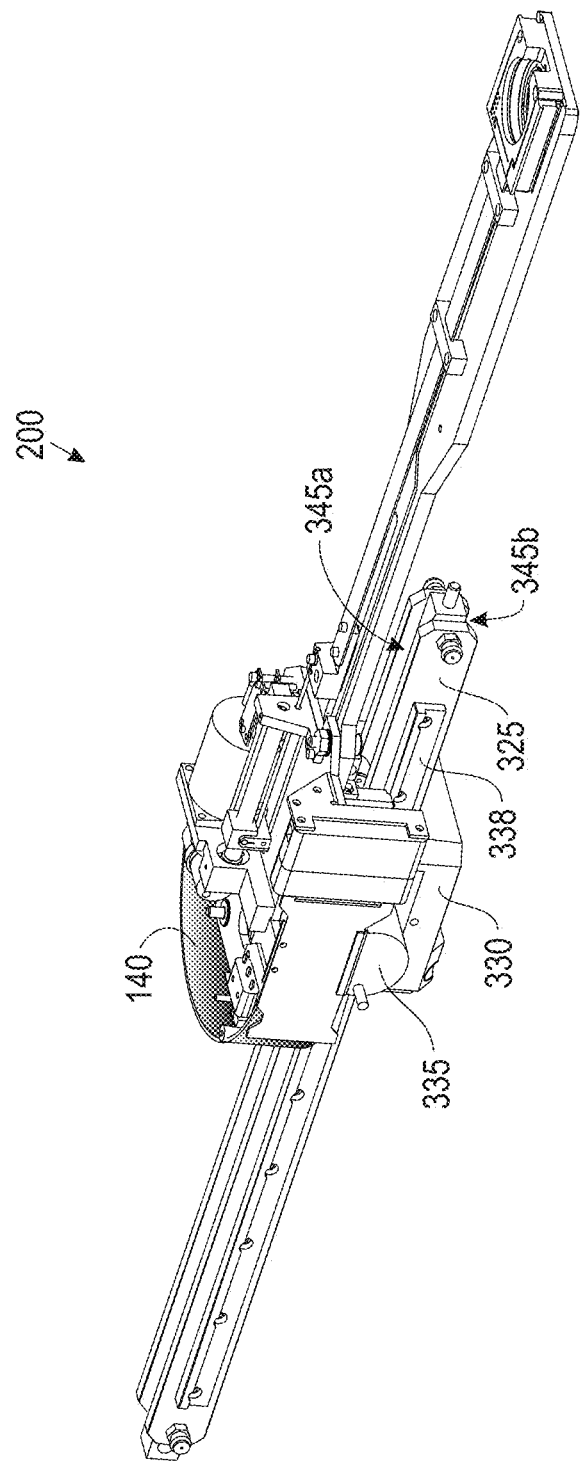
FIGS. 5A and 5B, illustrates views of one of the robotic devices and its relationship to a rail along which it travels.
Figure 5B:
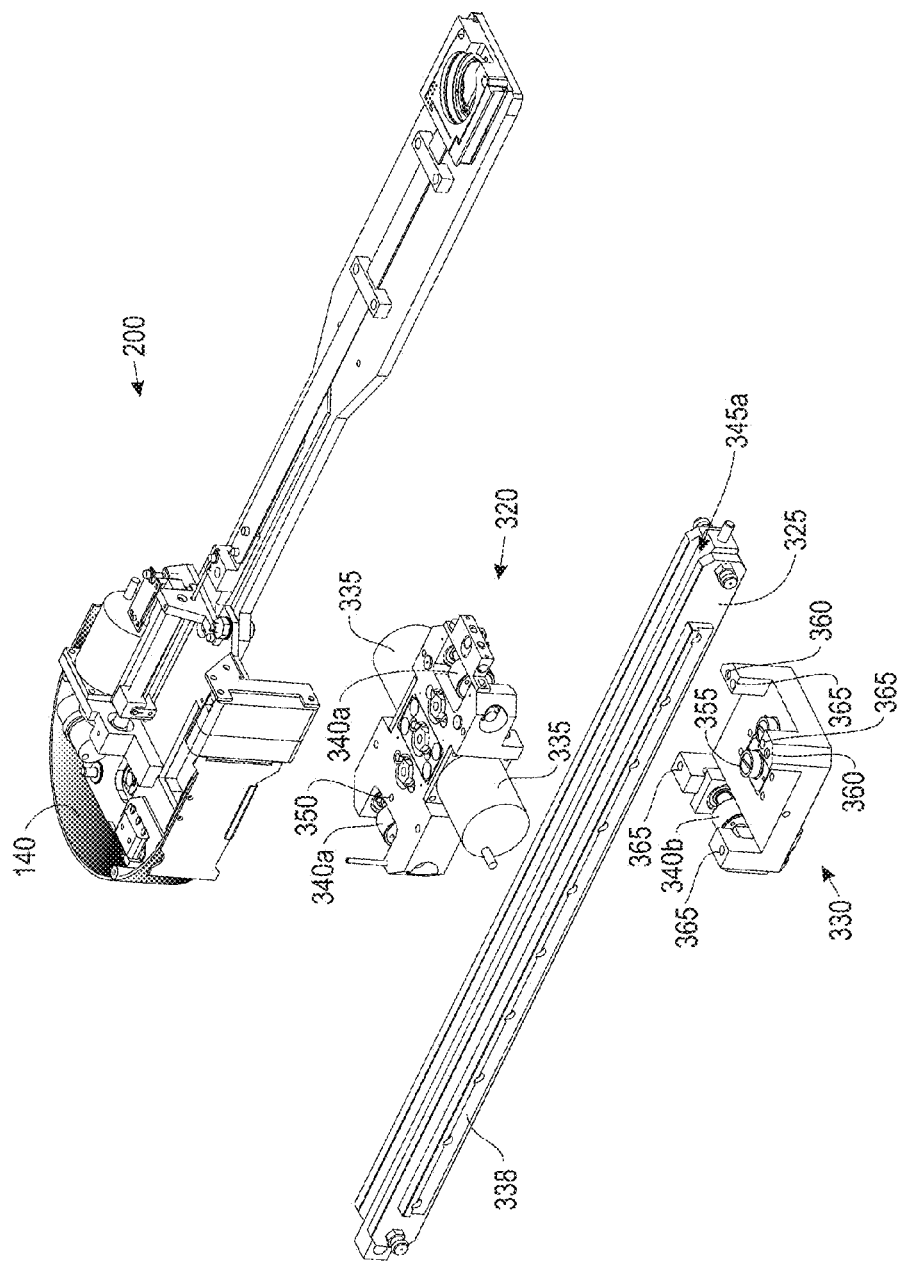

Movement of the assembly 200 (and likewise, assemblies 200a and 200b) is now described with respect to FIGS. 5A and 5B. FIG. 5A shows the assembly 200 in combination with other components designed to permit the assembly to move back and forth throughout the robot chamber 120 (see also FIG. 1). An exploded view of the same is shown in FIG. 5B, which shows the assembly 200, an upper carriage block 320, a rail 325, and a lower carriage block 330. When these components are assembled, the assembly 200 can move along and over the rail 325.

The upper carriage block 320 includes two drive motors 335, which when run together provide the torque necessary to drive the upper carriage block, the lower carriage block 330, and the assembly 200 along a gear rack 338 of the rail 325. The upper carriage block 320 includes two translational rollers 340a that run within a groove 345a in the rail 325. A pin (not shown) extends between a pinhole 350 in the upper carriage block 320 and the assembly 200, thereby holding together the upper carriage block and the assembly.

The lower carriage block 330 includes a translational roller 340b and centering rollers 355, all of which run along a groove 345b within the underside of the rail 325. Pins and screws that fit within pin holes 360 and screw holes 365, respectively, permit the lower carriage block 330 to be fixed precisely to the upper carriage block 320.

As mentioned previously, once the substrate carrier 225 (or 225a, 225b) has been brought to an intended location, the pusher 220 is used to apply force against the substrate carrier while the spatula 205 is retracted. Otherwise, the substrate carrier 225 might be unintentionally dislodged from its intended location (e.g., within a cassette in a load lock chamber or a deposition chamber). Preferably, the pusher 220 is in contact with the substrate carrier 225 for the entire time that the spatula 205 is being retracted. One way to accomplish this is to synchronize the motion of the assembly 200 (with its spatula 205) and the motion of the pusher 220, so that the distal end of the pusher extends away from the end effector (located at the distal end of the assembly 200) at the same speed that the end effector is retracted from the substrate carrier 225. To this end, the actions of the pusher motor 235 and the drive motors 335 may be coordinated using a motion controller (not shown) to control the respective movements of the pusher motor and drive motors, so that the assembly 200 retreats along the rail 325 at the same speed that the pusher 220 moves forward relative to the assembly. That is, the net effect is that the pusher 220 does not move with respect to the rail 325 (which is generally fixed) or the substrate carrier 225 (which is to be kept stationary at an intended location). Alternatively, the drive motors 335 may simply be turned off, and the pusher 220 (driven by the pusher motor 235) may push against the substrate carrier 225, so that the assembly 200 and its spatula 205 (along with the upper carriage block 320 and the lower carriage block 330) are pushed away from the substrate carrier.

The various parts of the robotic device 110 (and the other robotic device embodiments described herein) may be machined from stock materials. The spatula 205 (and 205a, 205b) may be advantageously made of molybdenum, since it is thermally and mechanically stable. Alternatively, the spatula could be made from a ceramic material such as Macor® (although ceramics are more brittle), or it could be made out of more compliant materials, such as plastic (e.g., polyimide), if the substrate carrier were made of a relatively soft material. Other parts in the assembly, such as the pusher 220 (or 220a, 220b), can be made of stainless steel, for example. The substrate carrier 225 (and 225a) is preferably fabricated from a magnetic material, and the substrate carrier 225b is preferably made from HAYNES® 230® alloy. The substrate carriers 225, 225a, and 225b are preferably designed to withstand oxidation (e.g., from oxygen or air) even at high temperatures (e.g., at 100° C., 150° C., 200° C., or greater), which are conditions encountered by the robotic devices described herein. At such high temperatures and under vacuum, oil-based lubricants are not recommended; rather, solid lubricants such as $MoS_2$ or $WS_2$ (e.g., Dicronite® coating) may be applied to parts such as gear surfaces to reduce friction.

The dimensions of the various parts disclosed herein may be selected in view of the intended application. A robotic device designed for use in a research environment (e.g., for transferring small wafers having a diameter of 20-30 mm) would be smaller than one designed for use in a manufacturing setting (e.g., for transferring wafers having a diameter of 300 mm). A smaller, research-oriented device may have, for example: an assembly (200, 200a, 200b) whose range of motion is between 200 mm and 600 mm, and a substrate carrier (225, 225a, 225b) having a width and a length of 20-60 mm. A larger device designed for manufacturing applications may have, for example: an assembly whose range of motion is between 600 mm and 1000 mm, an end effector whose width is less than 500 mm, and a substrate carrier having a width and a length of 300-500 mm. In either case, the range of motion of the pusher (220, 220a, 220b) is preferably at least that of the minimum lateral dimension of the substrate carrier.

The invention may be embodied in other specific forms without departing from its spirit or essential characteristics. The described embodiments are to be considered in all respects only as illustrative and not restrictive. The scope of the invention is therefore indicated by the appended claims rather than the foregoing description. All changes within the meaning and range of equivalency of the claims are to be embraced within that scope.

The invention claimed is:

1. A device, comprising:
 a robotic arm that includes an end effector, the end effector including:
 (i) an electrical or magnetic unit that has on and off modes, wherein the unit, when in the on mode, provides an electrical or magnetic attractive holding force between the unit and a substrate carrier that houses a substrate, so that the position of the substrate carrier remains fixed relative to the unit; and
 (ii) a pushing member that is configured to exert force against the substrate carrier, thereby preventing the substrate carrier from being retracted from a desired position while the unit is retracted away from the desired position of the substrate carrier; and
 a motor for moving the pushing member relative to the unit.

2. The device of claim 1, wherein the unit provides an electrostatic attractive force between the unit and the substrate carrier.

3. The device of claim 2, wherein the unit includes one or more electrodes that provide the electrostatic attractive force.

4. The device of claim 1, wherein the unit provides a magnetic attractive force between the unit and the substrate carrier.

5. The device of claim 4, wherein the unit includes one or more electromagnets that provide the magnetic attractive force.

6. The device of claim 4, wherein the unit includes a permanent magnet that provides the magnetic attractive force.

7. The device of claim 6, wherein the permanent magnet can be retracted without moving the pushing member.

8. The device of claim 1, wherein the end effector has a width of less than 500 mm.

9. The device of claim 1, wherein the pushing member has a range of motion that is at least 20 mm.

10. A method of using the device of claim 1, comprising:
(a) using the end effector to bring the substrate carrier to the desired position, wherein the attractive force holds the unit and the substrate carrier together while the substrate carrier is moved;
(b) moving the pushing member towards the substrate carrier, so that the pushing member exerts force against the substrate carrier;
(c) moving the unit away from the substrate carrier, while the pushing member exerts force against the substrate carrier, thereby maintaining the desired position of the substrate carrier; and
(d) retracting the pushing member so that the pushing member no longer contacts the substrate carrier,
wherein said steps (a), (b), (c), and (d) are carried out in turn.

11. The method of claim 10, wherein the substrate carrier is in a vacuum as steps (a)-(d) are carried out.

12. The method of claim 10, wherein the substrate carrier is exposed to a temperature greater than 100° C. as steps (a)-(d) are carried out.

13. The method of claim 10, wherein the substrate carrier is exposed to a temperature greater than 200° C. as steps (a)-(d) are carried out.

14. The method of claim 10, wherein the substrate carrier is exposed to an oxidizing environment as steps (a)-(d) are carried out.

15. A device, comprising:
a robotic arm that includes an end effector, the end effector including:
(i) a spatula member whose distal end includes an electrical or magnetic unit having on and off modes, wherein the unit, when in the on mode, provides an electrical or magnetic attractive holding force between the unit and a substrate carrier that houses a substrate, so that the position of the substrate carrier remains fixed relative to the unit; and
(ii) a pushing member that is configured to exert force against the substrate carrier, thereby preventing the substrate carrier from being retracted from a desired position while the unit is retracted away from the desired position of the substrate carrier.

16. The device of claim 15, comprising a motor for moving the pushing member relative to the unit.

17. The device of claim 15, wherein the unit includes one or more electrodes that provide the electrostatic attractive force.

18. The device of claim 15, wherein the unit provides a magnetic attractive force between the unit and the substrate carrier.

19. The device of claim 15, wherein the end effector has a width of less than 500 mm.

20. The device of claim 15, wherein the pushing member has a range of motion that is at least 20 mm.

* * * * *